(12) United States Patent
Lin et al.

(10) Patent No.: US 8,698,308 B2
(45) Date of Patent: Apr. 15, 2014

(54) BUMP STRUCTURAL DESIGNS TO MINIMIZE PACKAGE DEFECTS

(75) Inventors: Jing-Cheng Lin, Chu Tung Zhen (TW); Cheng-Lin Huang, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 11 days.

(21) Appl. No.: 13/362,913

(22) Filed: Jan. 31, 2012

(65) Prior Publication Data
US 2013/0193593 A1    Aug. 1, 2013

(51) Int. Cl.
*H01L 29/40* (2006.01)
(52) U.S. Cl.
USPC .................... 257/737; 257/673; 257/E23.021
(58) Field of Classification Search
USPC .................................. 257/673, 737, E23.021
See application file for complete search history.

(56) References Cited

U.S. PATENT DOCUMENTS

| | | | |
|---|---|---|---|
| 4,811,082 A | 3/1989 | Jacobs et al. |
| 4,990,462 A | 2/1991 | Sliwa, Jr. |
| 5,075,253 A | 12/1991 | Sliwa, Jr. |
| 5,380,681 A | 1/1995 | Hsu |
| 5,481,133 A | 1/1996 | Hsu |
| 6,002,177 A | 12/1999 | Gaynes et al. |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,355,501 B1 | 3/2002 | Fung et al. |
| 6,434,016 B2 | 8/2002 | Zeng et al. |
| 6,448,661 B1 | 9/2002 | Kim et al. |
| 6,461,895 B1 | 10/2002 | Liang et al. |
| 6,562,653 B1 | 5/2003 | Ma et al. |
| 6,570,248 B1 | 5/2003 | Ahn et al. |
| 6,600,222 B1 | 7/2003 | Levardo |
| 6,607,938 B2 | 8/2003 | Kwon et al. |
| 6,661,085 B2 | 12/2003 | Kellar et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |

(Continued)

*Primary Examiner* — Tan N Tran
(74) *Attorney, Agent, or Firm* — Lowe Hauptman & Ham, LLP

(57) ABSTRACT

The mechanisms for forming bump structures enable forming bump structures between a chip and a substrate eliminating or reducing the risk of solder shorting, flux residue and voids in underfill. A lower limit can be established for a α ratio, defined by dividing the total height of copper posts in a bonded bump structure divided by the standoff of the bonded bump structure, to avoid shorting. A lower limit may also be established for standoff the chip package to avoid flux residue and underfill void formation. Further, aspect ratio of a copper post bump has a lower limit to avoid insufficient standoff and a higher limit due to manufacturing process limitation. By following proper bump design and process guidelines, yield and reliability of chip packages may be increases.

20 Claims, 7 Drawing Sheets

(56) References Cited

U.S. PATENT DOCUMENTS

| | | |
|---|---|---|
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 2005/0140028 A1* | 6/2005 | Venkateswaran ............ 257/782 |
| 2009/0146303 A1* | 6/2009 | Kwon ............................ 257/741 |
| 2009/0283914 A1* | 11/2009 | Murayama .................... 257/773 |
| 2010/0155115 A1* | 6/2010 | Pang et al. ..................... 174/257 |
| 2010/0314756 A1* | 12/2010 | Lii et al. ........................ 257/737 |
| 2011/0092064 A1 | 4/2011 | Liu et al. |
| 2011/0101527 A1 | 5/2011 | Cheng et al. |

\* cited by examiner circle     oval     race track     rounded rectangle     rounded square

BUMP STRUCTURAL DESIGNS TO MINIMIZE PACKAGE DEFECTS

BACKGROUND

The fabrication of modern circuits typically involves many processing operations. Integrated circuits are first fabricated on a semiconductor wafer, which contains multiple duplicated semiconductor chips, each comprising integrated circuits. The semiconductor chips are then sawed from the wafer and packaged. The packaging processes have two main purposes: to protect delicate semiconductor chips, and to connect interior integrated circuits to exterior connections.

In packaging integrated circuit (IC) chips, solder joining is one method for bonding IC chips to package substrates, which may or may not include integrated circuits and/or other passive components. The package substrates may also include through silicon vias (TSVs). The solder joining process may involve application of flux on solder, solder reflowing, and flux removal. There are many challenges in chip packaging.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Figure 1A:
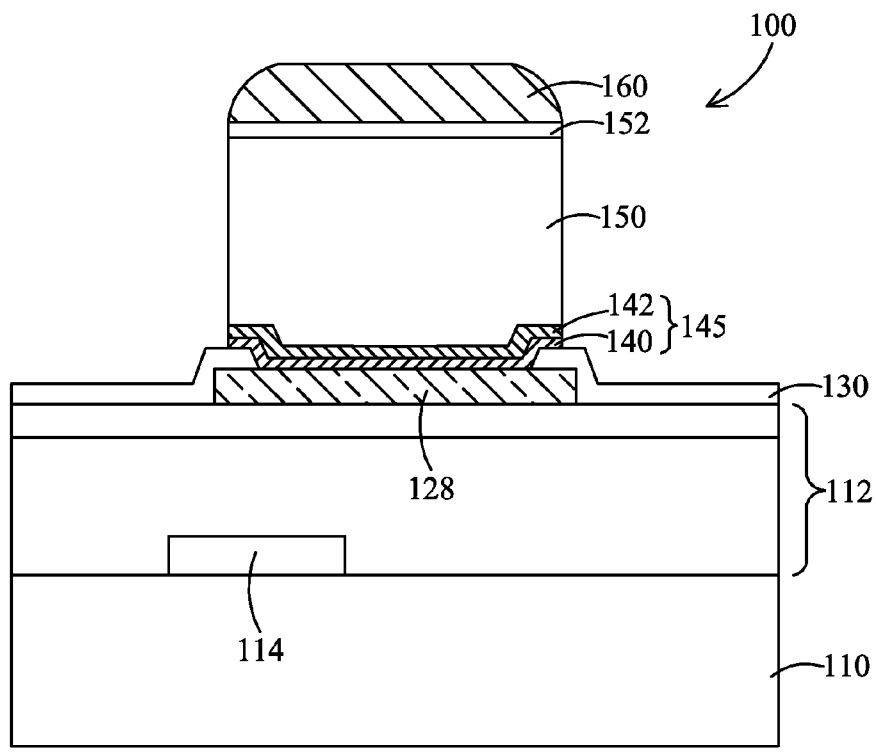
FIG. 1A is a cross sectional view of a bump structure with a substrate, in accordance with some embodiments.

FIG. 1A is a bump structure 100 with a substrate 110, in accordance with some embodiments. Substrate 110 may be a semiconductor substrate, such as a bulk silicon substrate, although it may include other semiconductor materials, such as group III, group IV, and/or group V elements. Semiconductor devices 114, such as transistors, may be formed at the surface of substrate 110. Substrate 110 may include silicon, gallium arsenide, silicon on insulator ("SOI") or other similar materials. Substrate 110 may also include passive devices such as resistors, capacitors, inductors and the like, or active devices such as transistors. Substrate 100 may, in an exemplary embodiment, include additional integrated circuits. Substrate 110 may be an interposer. In addition, the substrate 110 may also be of other materials in alternative embodiments. For example, multiple layer circuit boards may be used. Substrate 110 may also include bismaleimide triazine (BT) resin, FR-4 (a composite material composed of woven fiberglass cloth with an epoxy resin binder that is flame resistant), ceramic, glass, plastic, tape, film, or other supporting materials.

An interconnect structure 112, which includes metal lines and vias (not shown) formed therein and connected to semiconductor devices 114, is formed over substrate 110. The metal lines and vias may be formed of copper or copper alloys, and may be formed using the well-known damascene processes. Interconnect structure 112 may include commonly known inter-layer dielectrics (ILDs) and inter-metal dielectrics (IMDs).

A metal pad 128 is formed over interconnect structure 112. Metal pad 128 may comprise aluminum, and hence may also be referred to as aluminum pad 128, although it may also be formed of, or include, other materials, such as copper, silver, gold, nickel, tungsten, alloys thereof, and/or multi-layers thereof. Metal pad 128 may be electrically connected to semiconductor devices 114, for example, through underlying interconnection structure 112. The metal pad 128 may be a top metal layer or a redistribution layer (RDL). In some embodiments, a passivation layer 130 is formed to cover edge portions of metal pad 128. The passivation layer 130 may be formed of polyimide or other known dielectric materials. Additional passivation layers may be formed over interconnect structure 112 and at the same level, or over, metal pad 128. The additional passivation layers may be formed of materials such as silicon oxide, silicon nitride, un-doped silicate glass (USG), polyimide, and/or multi-layers thereof.

The bump structure 100 includes a diffusion barrier layer 140 and a thin seed layer 142, in accordance with some embodiments. Diffusion barrier layer 140 may be a titanium layer, a titanium nitride layer, a tantalum layer, or a tantalum nitride layer. The materials of seed layer 142 may include copper or copper alloys, and hence is referred to as copper seed layer 142 hereinafter. However, other metals, such as silver, gold, aluminum, and combinations thereof, may also be included. The combined diffusion barrier layer 140 and copper seed layer 142 may also be referred to as an under bump metallurgy (UBM) layer 145.

In some embodiments, bump structure 100 also includes a copper layer 150, a metal layer 152, and a solder layer 160. The copper layer 150, the metal layer 152, and the solder layer 160 are formed by plating with a photo mask defining the openings, in accordance with some embodiments. In some embodiments, metal layer 152 is a nickel-containing layer comprising, for example, a nickel layer or a nickel alloy layer by plating. In some other embodiments, metal layer 152 contains cobalt or tungsten. Metal layer 152 prevents the formation of an inter-metallic compound (IMC) between copper and solder. Solder layer 160 may be a lead-free pre-solder layer formed of, for example, SnAg, or a solder material, including alloys of tin, lead, silver, copper, nickel, bismuth, or combinations thereof. In FIG. 1A, the solder layer 160 is rounded as a result of reflow.

The thickness of copper layer 150 is larger than the thickness of solder layer 160; the bump structure 100 is referred to as a copper post (or pillar) bump. For advanced chip packaging, the bump pitch and bump width are reduced. Copper post bumps enable reduction of bump pitch and width. The embodiment of FIG. 1A is merely an example; other embodiments of bumps are also possible. Further details of bump formation process may be found in U.S. patent application Ser. No. 12/842,617, filed on Jul. 23, 2010 and entitled "Preventing UBM Oxidation in Bump Formation Processes," and U.S. patent application Ser. No. 12/846,353, filed on Jul. 29, 2010 and entitled "Mechanisms for Forming Copper Pillar Bumps," both of which are incorporated herein in their entireties.

Figure 1B:
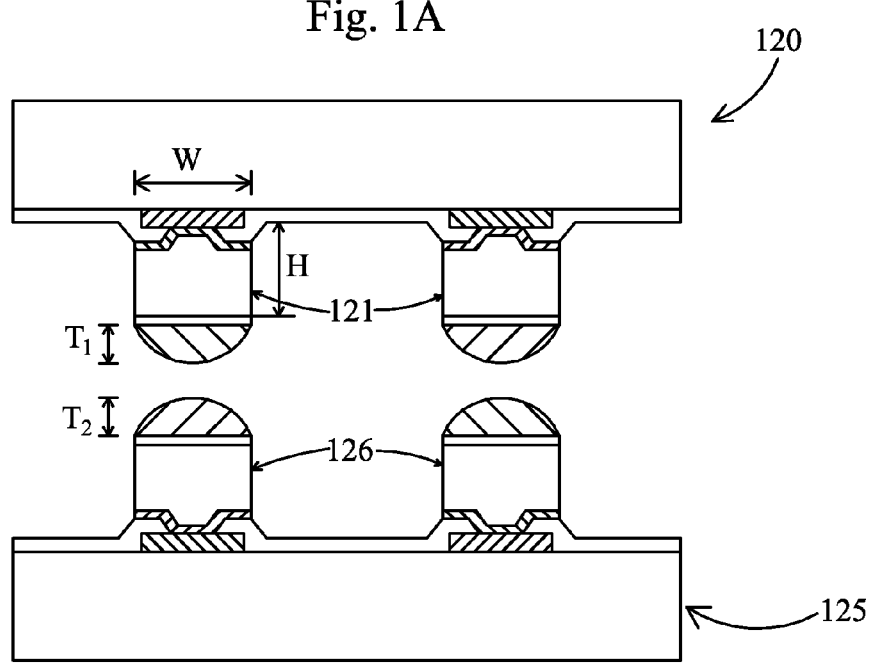
FIG. 1B is a cross sectional view of a chip and a substrate after copper post bumps are formed respectively, in accordance with some embodiments.

FIG. 1B is a cross sectional view of a chip 120 and a substrate 125 after copper post bumps 121 and 126 are formed respectively, in accordance with some embodiments. Substrate 125 may include active or passive devices and may have through silicon vias (TSVs). Copper post bumps 121 are aligned with copper post pumps 126 for bonding.

Figure 1C:
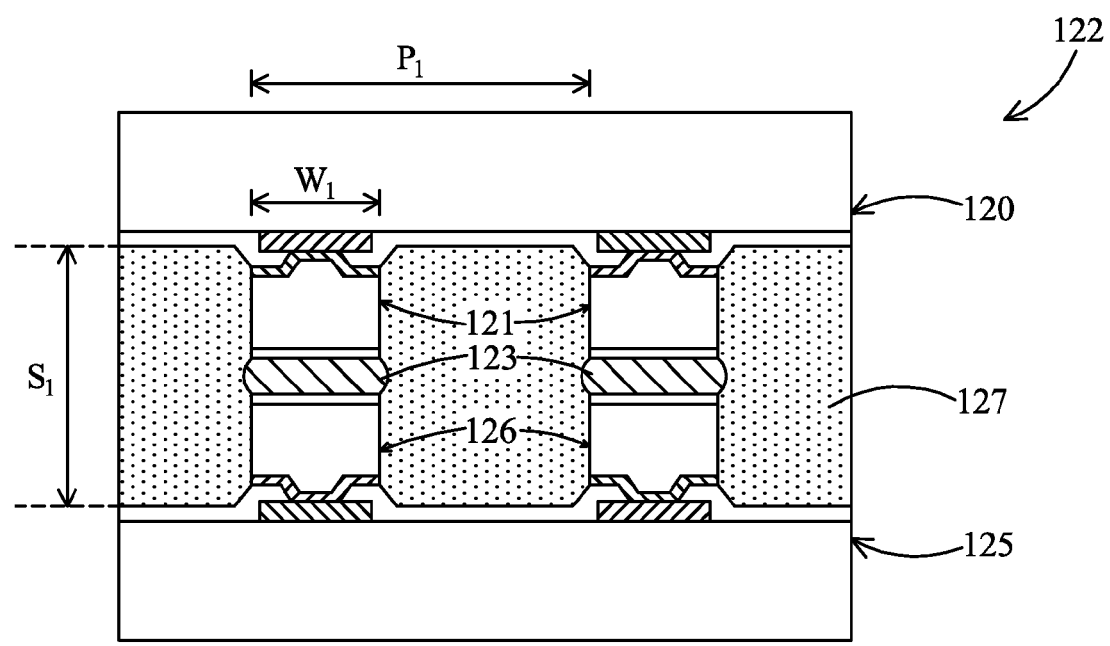
FIG. 1C is a cross-sectional view of a chip bonded to a substrate to form a package, in accordance with some embodiments.

FIG. 1C shows a cross-sectional view of chip 120 bonded to substrate 125 to form package 122, in accordance with some embodiments. A space between chip 120 and substrate 125 is filled with an underfill 127 and a joined solder 123 has a smooth profile. The bump structures in FIG. 1C have a pitch $P_1$ and a standoff (or standoff height) $S_1$. The width of copper post bumps 121 and 126 are $W_1$.

Figure 1D:
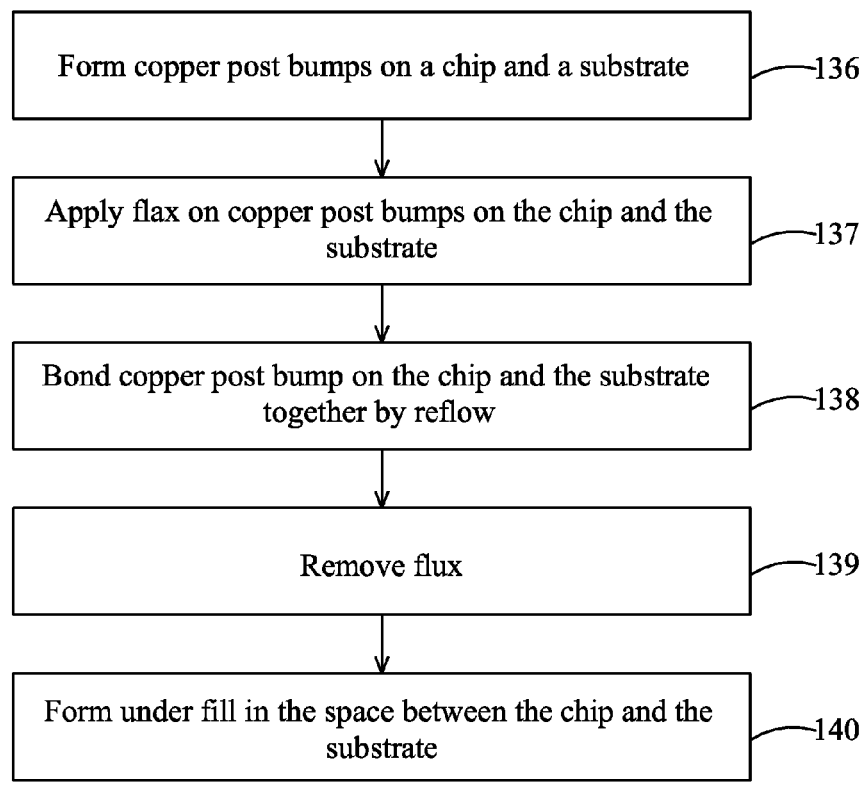
FIG. 1D is a process flow for bonding a chip and a substrate, in accordance with some embodiments.

FIG. 1D shows a process flow 135 for bonding chip 120 and substrate 125, in accordance with some embodiments. At operation 136, copper post bumps are formed on chip 120 and substrate 125. At operation 137, flux is applied on copper post bumps 121 and 126 respectively, in some embodiments. Flux is a chemical cleaning agent that helps prevent oxidation of solder during the solder reflow process. The application of flux may involve dipping bumps in flux or dispensing flux on copper post bumps. In some embodiments, flux is applied to one of copper post bump 121 or 126, but not on both copper post bumps 121 and 126. After flux application is completed, copper post bumps 121 and 126 are bonded together by solder reflow at operation 138. The flux is then removed (or cleaned) from the space between chip 120 and substrate 125, which are bonded together through bumps 121 and 126, at operation 139. Flux removal (or clean) may involve spraying solvent, applying de-ionized (DI) water, heating, and drying the chip package 122, in accordance with some embodiments. After flux is removed, underfill is formed in the space between the chip 120 and substrate 125 at operation 141. Underfill formation may involve injecting the underfill material in the space and also curing the underfill material.

Figure 1E:
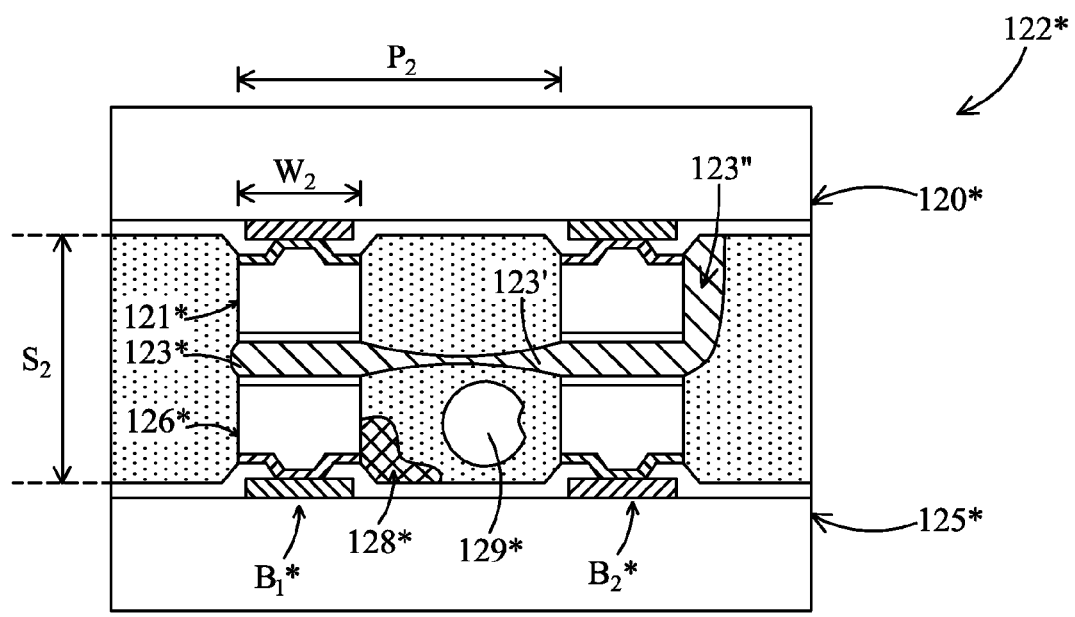
FIG. 1E is a cross sectional view of a chip package, in accordance with some embodiments.

FIG. 1E is a cross sectional view of a chip package 122*, in accordance with some embodiments. Chip package 122* includes a chip 120* and a substrate 125* with copper post bumps 121* and 126* bonded together to form bump structures $B_1$* and $B_2$*. Chip 120*, substrate 125*, bumps 121* and bumps 126* are similar to chip 120, substrate 125, bumps 121, and bumps 126 respectively. Bumps 121* and 126* have smaller pitch, which is distance $P_2$, than copper post bumps 121 and 126, whose pitch is distance $P_1$. The width $W_2$ of copper post 121* and 126* is smaller than $W_1$ of FIG. 1C. The standoff $S_2$ of package 122* is also smaller than standoff $S_1$ of FIG. 1C.

FIG. 1E depicts a bridging of solder 123* between bump structures $B_1$*and $B_2$* (see bridged region 123'), which is a result of narrow pitch and/or an excess amount of solder 123*. Solder bridging causes undesirable signal errors and chip failure. FIG. 1E also shows that some solder 123* overflows the covers the sidewall of copper post 121* (see region 123"), which may also be called as wetting of solder on sidewalls of copper post. Solder wetting on copper post increases the risk of shorting and degradation of copper pillar due to formation of inter-metal compound (IMC) between copper and solder.

As mentioned above in process flow 135, after the copper post bumps 121* and 126* are solder together to form bump structures $B_1$* and $B_2$*, flux is removed. Due to decreased pitch $P_2$ between copper post bumps 121* and 126* and reduced standoff $S_2$, flux is difficult to remove in some regions of chip package 122*. In addition, the presence of bridged region 123' makes the removal of flux even more difficult to remove in some regions of chip package 122*. FIG. 1E shows residual flux 128* between bumps $B_1$* and $B_2$* and under bridged region 123'. Residual flux 128* could cause void(s) in underfill. After flux is removed, underfill 127* is formed. The reduced space between bridged region 123' and residual flux 128* causes a void 129* to be formed in underfill 127*. Void 129* could cause early bump failure during device operation due to insufficient bump strength and poor underfill protection. Because there are various problems that are caused by poor formation of bump structures $B_1$* and $B_2$*, properly forming bump structures between packages is important to improve yield and reliability for advanced packaging with smaller pitch, smaller copper post width, and lower standoff.

Figure 2A:
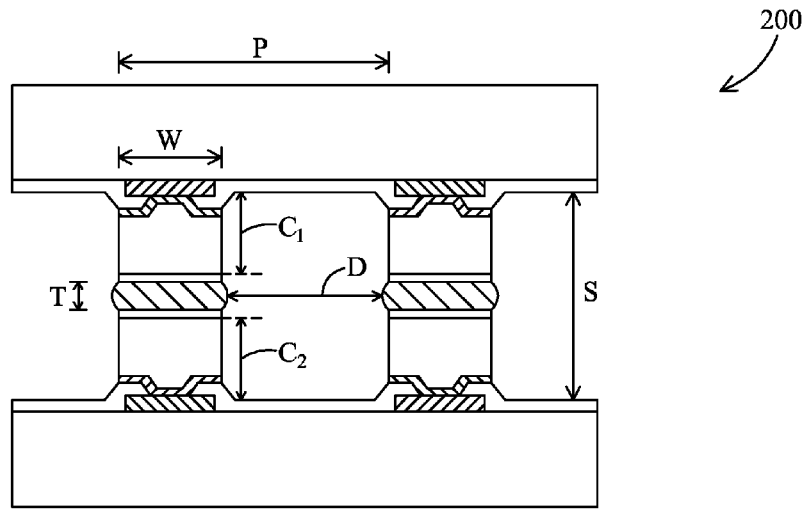
FIG. 2A is a cross-sectional view of a chip package, in accordance with some embodiments.
Figure 2B:
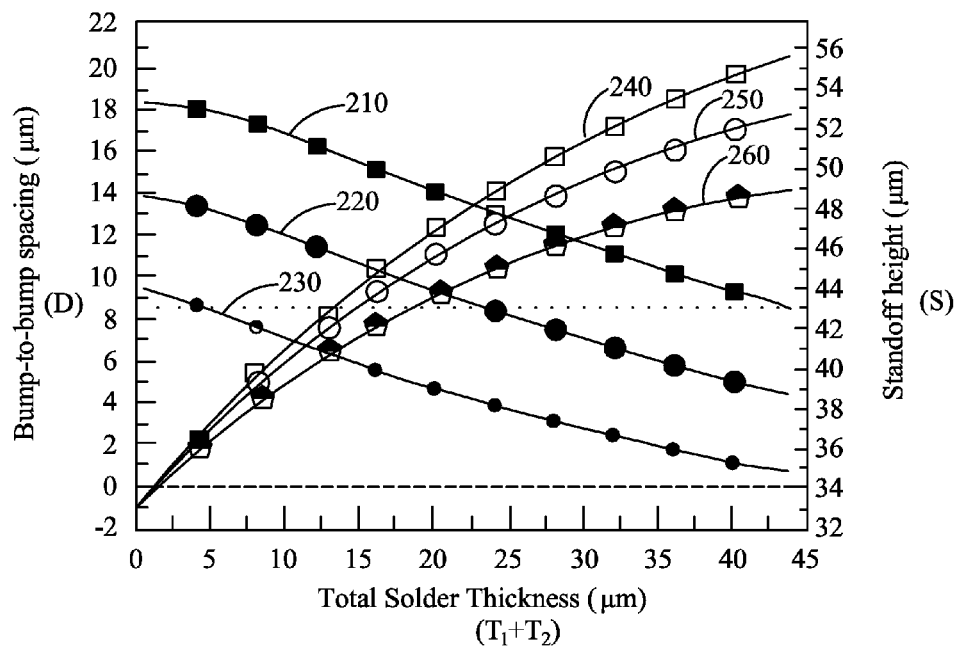
FIG. 2B is a graph of bump pitches, bump-to-bump spacing, and standoff height versus total thickness of solder layers, in accordance with some embodiments.

FIG. 2A is a cross-sectional view of chip package 200, in accordance with some embodiments. Chip package 200 is similar to chip package 122* and chip package 200 has a standoff S, and a pitch P. The width of copper layer of the copper post structures is W. The thickness of a solder layer T is approximately equal to an added thickness of solder layer for copper post bump 121 ($T_1$) on chip and for copper post bump 126 ($T_2$) on substrate when $T_1+T_2$ is small. $T_1$ and $T_2$ are defined in FIG. 1B. Where $T_1+T_2$ is larger; T is noticeably smaller than $T_1+T_2$ due to merged solder material (in solder junction 123) and solder protruding beyond the boundaries of copper posts. The height of the copper layer of copper post bump 121 is $C_1$ and the height of copper layer of copper post bump 126 is $C_2$. The narrowest distance between neighboring solder layers is D (or bump-to-bump spacing). FIG. 2B is a graph of bump pitches, bump-to-bump spacing, and standoff height versus total thickness of solder layers ($T_1+T_2$), in accordance with some embodiments. In some embodiments, $T_1$ is equal to $T_2$. FIG. 2B depicts D decreases with an increase of total solder thickness ($T_1+T_2$). When solder layer become thicker, the protruding portion of the solder layer becomes larger, which decreases bump-to-bump spacing D.

FIG. 2B shows calculated results of three different bump designs, in accordance with some embodiments. In the examples in FIG. 2B, the width of the copper post is half the pitch size. Curve 210 represents variation of bump-to-bump spacing D with solder thickness T for bumps with 40 μm pitch (P) and 20 μm width W of copper layer. Curve 220 is similar to curve 210; however, the pitch for curve 220 is 30 μm and the width W is 15 μm. Similarly, the pitch for curve 230 is 20 μm and the width W is 10 μm. The data of curves 210-230 show that bump-to-bump spacing D decreases with reduced pitch P and reduced width W. The bump-to-bump spacing D decreases with increase in total bump thickness ($T_1+T_2$). When $T_1+T_2$ is larger, more solder at joined solder 123 protrudes outwardly. As a result, the bump-to-bump spacing D is decreased.

Advanced packaging utilizes smaller pitch sizes (P) with smaller bump widths (W). The reduced bump-to-bump spacing D makes advanced packaging more challenging. FIG. 2B shows that the bump-to-bump spacing D for the smallest bump pitch P and width W, 20 μm P and 10 μm W, is almost zero (shorting) when the total solder thickness T is about 45 μm. In contrast, the bump-to-bump spacing D is about 8 μm, when the total solder thickness T is about 45 μm for bumps with 40 μm bump pitch and 20 μm bump width. FIG. 2B shows that the allowable total thickness of solder layer would decrease with reduced pitch size and bump width.

FIG. 2B is also a graph of the standoff S versus total solder thickness ($T_1+T_2$) for three copper widths when $C_1$ (height of copper layer for bump 121) and $C_2$ (height of copper layer for bump 126) are both 15 μm. The copper post width for curve 240 is 20 μm. The copper post width for curve 250 is 15 μm and the copper post width for curve 260 is 10 μm. The standoff increases with the increase of the total thickness of solder layers for all three curves. However, the rate of increase is more for bumps with larger copper width because more solder is available to increase standoff (total height) of the bump structure.

Figure 3A:
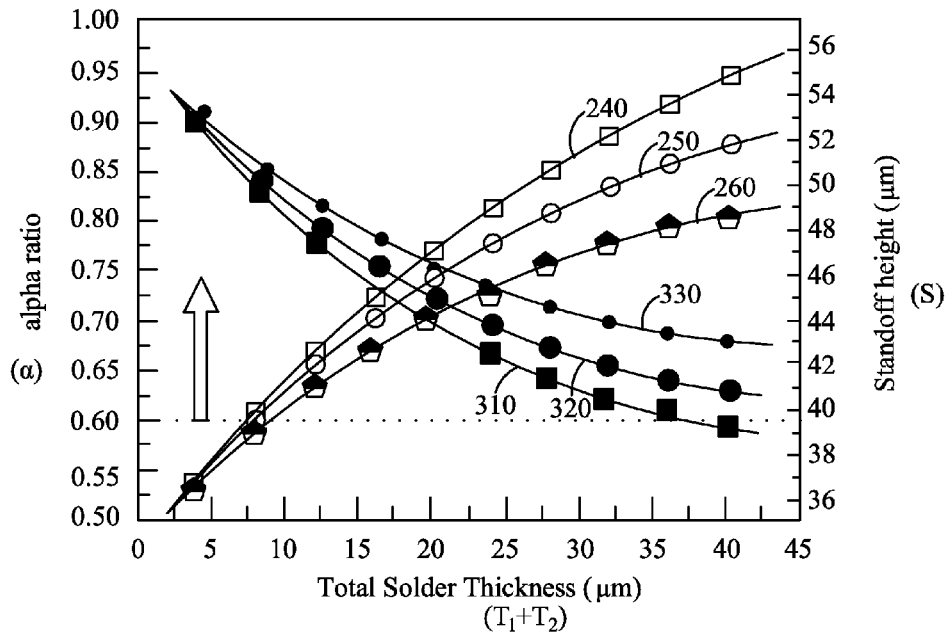
FIG. 3A is a graph of α ratios and standoff height for copper post widths of 20 µm, 15 µm, and 10 µm versus total solder thickness, in accordance with some embodiments.

FIG. 3A is a graph of an alpha (α) ratio as a function of total thickness of solder layers ($T_1+T_2$), in accordance with some embodiments. The α ratio is define as a ratio of $C_1+C_2$ (total copper height) to S (standoff). FIG. 3A includes three curves of the α ratio. In the example of FIG. 3A, $C_1=C_2=15$ mm. Curve 310 is calculated α ratio results for a width of copper layer of 20 μm. Curve 320 is calculated α ratio results for a width of copper layer of 15 μm. Curve 330 is calculated α ratio results for a width of copper layer of 10 μm. When the total thickness $T_1+T_2$ of solder layer increases, the α ratio decreases due to an increase in standoff height S. Curves 240, 250 and 260 for standoff(s) of FIG. 2B are also shown in FIG. 3A. Since S increases faster for copper layer with larger width, curve 330 is above curves 310 and 320. All α ratios in FIG. 3A are above about 0.6 when the total solder thickness is equal to or less than about 40 μm. As mentioned above, when the total solder thickness is at about 45 μm, there is a risk of shorting (or zero bump-to-bump spacing) for bumps with small pitch and width (P=20 μm and W=10 μm). There is reduced risk of shorting when the total solder thickness is equal to or less than about 40 μm even for bumps with small pitch and width (P=20 μm and W=10 μm).

Figure 3B:
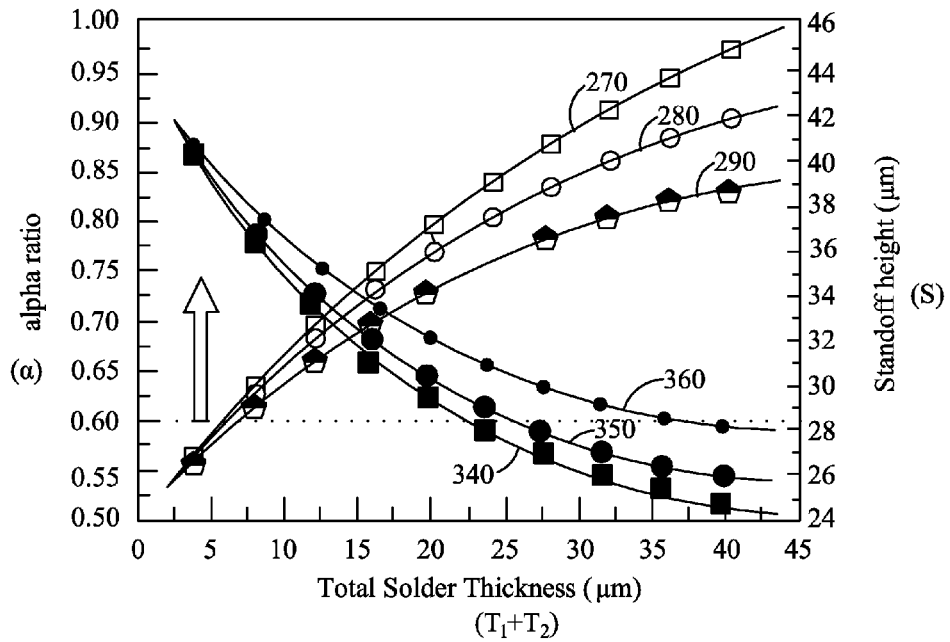
FIG. 3B is a graph of α ratios and standoff height for copper post widths of 20 µm, 15 µm, and 10 µm versus total solder thickness, in accordance with some embodiments.

FIG. 3B is a graph of α ratios and standoffs S for copper post widths of 20 μm, 15 μm, and 10 μm, in accordance with some embodiments. For the standoffs S in FIG. 3B, C1=C2=10 μm. Curve 270 is calculated standoffs for a width of copper layer of 20 μm. Curve 280 is calculated S results for a width of copper layer of 15 μm. Curve 290 is calculated S results for a width of copper layer of 10 μm. FIG. 3B also includes the α ratio as a function of total solder thickness. In FIG. 3B, Curve 340 is the α ratio for a copper post having a width of 20 μm. Curve 350 is the α ratio results for a copper post having a width of 15 μm. Curve 360 is the α for a copper post having a width of 10 μm. The α ratios for lower height of copper layer (C1=C2=10 μm) in FIG. 3B are lower than the α ratios in FIG. 3A (C1=C2=15 μm). Although the results depicted in FIGS. 3A and 3B are for copper posts with circular top views, the result trends are similar for copper posts with different shapes of top views.

The results in FIG. 2B illustrate that for bump structures with finer width W, the total solder thickness T is lower than bump structures with larger width W. This is demonstrated by curve 240 being higher than curve 260, since increased total solder thickness T increases standoff S. As mentioned above, the total solder thickness $T_1+T_2$ is set to be equal to or less than about 40 μm to avoid shorting for bumps as small as 20 μm pitch and 10 μm width. The results in FIGS. 3A and 3B illustrate that the α ratios of the bump structures are higher for bump structures with finer pitches. In some embodiments, the α ratio is equal to or greater than about 0.6 to avoid shorting. The upper limit of the α ratio is 1.0. In some embodiments, the α ratio is equal to or greater than about 0.55. In some embodiments, the α ratio is equal to or greater than about 0.5. As mentioned above, the lower limit of the α ratio depends on the width and height of the copper post. When the α ratio is too low, there is an increased risk of shorting.

Figure 4A:
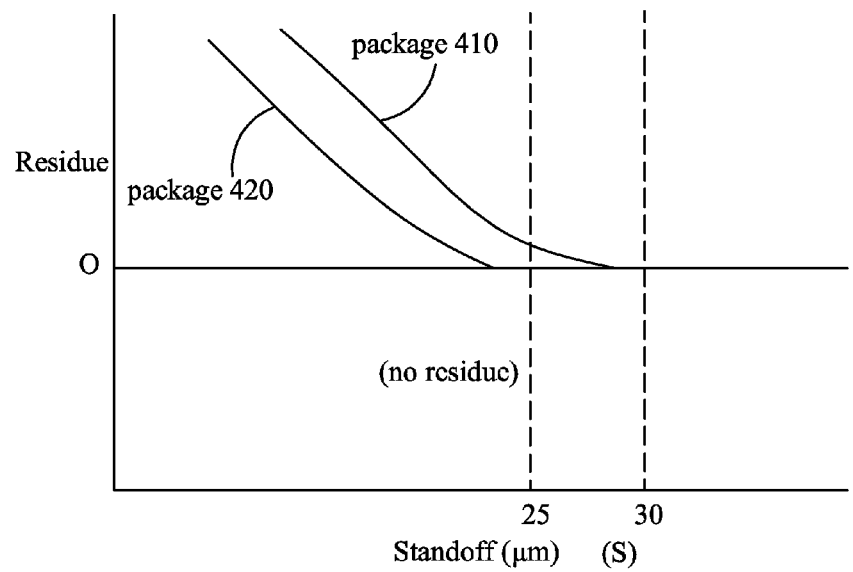
FIG. 4A is a graph of residue of flux cleaning for two packages as a function of standoff, in accordance with some embodiments.

In addition to defining limits for total solder thickness T and the α ratio, standoff (S) limit is also important. FIG. 4A is a graph of residue of flux cleaning for a package A (curve 410) with a large chip and a package B (curve 420) with a small chip as a function of standoff S, in accordance with some embodiments. The total surface area of package B is smaller than package A. During flux removing, if the standoff is too small, the flux between the chip and substrate cannot be removed completely and leaves residue behind. Packages with higher standoffs are easier to clean because the cleaning solution more easily reaches the space between the chip and the substrate.

In addition to standoff, flux cleaning is also affected by chip size on the package. For larger packages (or packages with larger surface areas), flux cleaning solution and/or rising liquid need to travel further into the space between the chip and the substrate to remove flux near the center of the package. In contrast, for smaller packages, flux removal solution and/or rising liquid do not need to travel a long distance to reach flux near the center of the package. As illustrated in FIG. 4A, the flux removing curve 410 for package A has more residue than the curve 420 for package B when the standoff is the same for both packages. The goal of flux removal is to have no residue. The limit of standoff S for complete flux removal is equal to or greater than about 30 μm, in some embodiments. In some embodiments, the limit of standoff S for complete flux removal is equal to or greater than about 25 μm. The limit of standoff depends on the package size. Further, the limit of standoff is also affected by pattern density. In some embodiments, the limit of standoff increases with pattern density.

Standoff also affects void formation. Lower standoff has higher risk of forming voids, which is related to flux removal. As described above, flux residue increases the risk of underfill void formation. In some embodiments, the limit of standoff S for preventing underfill void formation is equal or greater than about 30 μm. In some embodiments, the limit of standoff S is equal to or greater than about 25 μm. The limit of standoff also depends on the package size and pattern density.

Figure 4B:
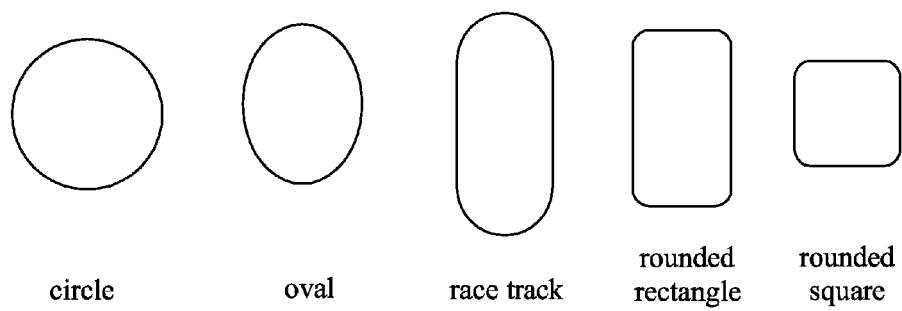
FIG. 4B is various top views of copper post bumps, in accordance with some embodiments.

For advanced packaging, the widths and pitches of copper post bumps continue to decrease. In some embodiments, the width (W) of the copper post is equal to or less than about 30 μm. In some embodiments, the pitch (P) of the copper post is equal to or less than about 60 μm. FIG. 4B shows various top views of copper post bumps, in accordance with some embodiments. The copper post bumps may have a top view of circle, oval, race track, rounded rectangle (rounded corners), rounded square, etc. Other shapes are also possible.

In addition, the aspect ratio of the copper layer (or pillar) may be also be important. Aspect ratio, A, of the copper layer is defined to the ratio of height H of the copper layer to the width W of the copper layer, as shown in FIG. 1B. A minimal value of aspect ratio reduces the risk of the standoff being below the limit of standoff. In some embodiments, aspect ratio is equal to or greater than about 0.45.

The mechanisms for forming bump structures described above enable forming bump structures between a chip and a substrate eliminating or reducing the risk of solder shorting, flux residue and voids in underfill. A lower limit can be established for a α ratio, defined by dividing the total height of copper posts in a bonded bump structure divided by the standoff of the bonded bump structure, to avoid shorting. A lower limit may also be established for standoff of the chip package to avoid flux residue and underfill void formation. Further, aspect ratio of a copper post bump has a lower limit to avoid insufficient standoff and a higher limit due to manufacturing process limitation. By following proper bump design and process guidelines, yield and reliability of chip packages may be increases.

In accordance with some embodiments, a chip package is provided. The chip package includes a first copper post on a chip having a first height, and a second copper post on a substrate having a second height. The second copper post is bonded to the first copper post by a solder layer to form a first copper post bump structure of the chip package having a standoff. A ratio of a sum of the first height and the second height to the standoff is equal to or greater than about 0.6 and less than 1.

In accordance with some embodiments, a chip package is provided. The chip package includes a first copper post on a chip having a first height, and a second copper post on a substrate having a second height. The second copper post is bonded to the first copper post by a solder layer to form a first copper post bump structure of the chip package with a standoff. A ratio of a sum of the first height and the second height to the standoff is equal to or greater than about 0.6 and less than 1, and a first width of the first copper post is equal to or less than about 30 µm.

In accordance with some embodiments, a method of forming a chip package is provided. The method includes providing a chip with a plurality of first copper post bumps, and the plurality of first copper post bumps have a first height of copper post. The method also includes providing a substrate with a plurality of second copper post bumps, and the plurality of second copper post bumps have a second height of copper post. The method further includes bonding the plurality of first copper post bumps to the plurality of second copper post bumps by reflowing solder layers on the plurality of first copper post bumps and the plurality of second copper post bumps together to form a first copper post bump structure of the chip package. The first copper post bump structure has a standoff, wherein a ratio of a sum of the first height of copper post and the second height of copper post to the standoff is equal to or greater than about 0.6 and less than 1.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure

What is claimed is:

1. A chip package, comprising:
a first copper post on a chip having a first height;
a second copper post on a substrate having a second height, wherein the second copper post is bonded to the first copper post by a solder layer to form a first copper post bump structure of the chip package having a standoff, wherein a ratio of a sum of the first height and the second height to the standoff is equal to or greater than about 0.6 and less than 1; and
an underfill between the chip and the substrate, wherein the underfill is free of voids.

2. The chip package of claim 1, wherein a first width of the first copper post is equal to or less than about 30 µm and a second width of the second copper post is also equal to or less than about 30 µm.

3. The chip package of claim 1, further comprising a second copper post bump structure formed next to the first copper post bump structure, wherein a pitch between the first and the second copper post bump structures is equal to or less than about 60 µm.

4. The chip package of claim 1, wherein an aspect ratio of the first copper post is equal to or greater than about 0.45.

5. The chip package of claim 1, wherein the standoff is equal to or greater than about 30 µm.

6. The chip package of claim 1, wherein the first copper post is disposed on a metal pad and there is an under-bump metallurgy (UBM) layer between the first copper post and the metal pad.

7. The chip package of claim 1, wherein the substrate is an interposer.

8. The chip package of claim 7, wherein the interposer includes a through silicon via.

9. The chip package of claim 1, wherein the first copper post has a shape of one of the following circle, oval, race track, rounded rectangle or rounded square.

10. The chip package of claim 1, wherein the solder layer is a lead-free layer containing SnAg, or alloys of tin, lead, silver, copper, nickel, bismuth, cobalt, tungsten or combinations thereof.

11. The chip package of claim 1, wherein sidewall surfaces of the first copper post and sidewall surfaces of the second copper post are free of the solder layer.

12. A chip package, comprising:
a first copper post on a chip having a first height; and
a second copper post on a substrate having a second height, wherein the second copper post is bonded to the first copper post by a solder layer to form a first copper post bump structure of the chip package with a standoff, wherein a ratio of a sum of the first height and the second height to the standoff is equal to or greater than about 0.6 and less than 1, and a first width of the first copper post is equal to or less than about 30 µm, and sidewall surfaces of the first copper post and sidewall surfaces of the second copper post are free of the solder layer.

13. The chip package of claim 12, further comprising a second copper post bump structure formed next to the first copper post bump structure, wherein a pitch between the first and the second copper post bump structures is equal to or less than about 60 µm.

14. The chip package of claim 12, further comprising:
a metal pad on the chip, wherein the first copper post is disposed on the metal pad; and an under-bump metallurgy (UBM) layer between the first copper post and the metal pad.

15. The chip package of claim 12, wherein an aspect ratio of the first copper post is equal to or greater than about 0.45.

16. A chip package, comprising:
a chip;
a substrate;
a plurality of copper post bump structures electrically connecting the chip to the substrate, wherein each copper post bump structure of the plurality of copper post bump structures comprises:
a first copper post on the chip, the first copper post having a first height;
a second copper post on the substrate, the second copper post having a second height; and
a solder layer bonding the first copper post to the second copper post, wherein sidewall surfaces of the first copper post and sidewall surfaces of the second copper post are free of the solder layer,
wherein the chip package has a standoff distance between the chip and the substrate, wherein a ratio of a sum of the first height and the second height to the standoff distance is equal to or greater than about 0.5 and less than 1, and a pitch between a first copper post bump structure of the plurality of copper post bump structures and a second copper post bump structure of the plurality of copper post bump structure is equal to or less than about 60 micrometers ($\mu m$).

17. The chip package of claim 16, wherein a first width of the first copper post is equal to or less than about 30 $\mu m$ and a second width of the second copper post is also equal to or less than about 30 $\mu m$.

18. The chip package of claim 16, further comprising an underfill fills a space between the chip and the substrate, and the underfill fills a space between the first copper post bump structure and the second copper post bump structure.

19. The chip package of claim 16, wherein the each copper post bump structure of the plurality of copper post bump structures comprises:
a metal pad on the chip, wherein first copper post is disposed on the metal pad; and
an under-bump metallurgy (UBM) layer between the first copper post and the metal pad.

20. The chip package of claim 16, wherein the standoff is equal to or greater than 25 $\mu m$.

* * * * *